United States Patent
Park et al.

(10) Patent No.: US 9,642,196 B2
(45) Date of Patent: May 2, 2017

(54) LIGHT-EMITTING DEVICE PACKAGE AND LIGHT-EMITTING APPARATUS

(71) Applicant: SAMSUNG ELECTRONICS CO., LTD., Suwon-si, Gyeonggi-do (KR)

(72) Inventors: In-soo Park, Gyeonggi-do (KR); Min-young Son, Seoul (KR); Myoung-soo Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 267 days.

(21) Appl. No.: 14/189,554

(22) Filed: Feb. 25, 2014

(65) Prior Publication Data

US 2014/0265903 A1 Sep. 18, 2014

(30) Foreign Application Priority Data

Mar. 14, 2013 (KR) ........................ 10-2013-0027491

(51) Int. Cl.
*H05B 33/08* (2006.01)
*H01L 25/16* (2006.01)
*H01L 23/00* (2006.01)

(52) U.S. Cl.
CPC ......... *H05B 33/0809* (2013.01); *H01L 24/73* (2013.01); *H01L 25/167* (2013.01); *H05B 33/0803* (2013.01); *H01L 2224/45139* (2013.01); *H01L 2224/48091* (2013.01); *H01L 2224/73257* (2013.01); *H01L 2924/12036* (2013.01); *H01L 2924/15787* (2013.01)

(58) Field of Classification Search
CPC H05B 33/00; H05B 33/0803; H05B 33/0806; H05B 33/0809; H05B 37/00; H01L 2224/73257; H01L 2924/00; H01L 27/02
USPC ....... 315/291, 307, 308, 185 R, 192; 257/88, 257/89, E27.051, E25.02, E25.011, 257/E25.012, E25.015, E25.016
See application file for complete search history.

(56) References Cited

U.S. PATENT DOCUMENTS

| | | | |
|---|---|---|---|
| 7,956,367 B2 | 6/2011 | Sakai et al. |
| 8,026,675 B2 | 9/2011 | Lee et al. |
| 8,084,774 B2 | 12/2011 | Sakai et al. |
| 8,097,889 B2 | 1/2012 | Sakai et al. |
| 8,129,729 B2 | 3/2012 | Sakai et al. |

(Continued)

FOREIGN PATENT DOCUMENTS

| | | |
|---|---|---|
| JP | 2004-006582 A | 1/2004 |
| JP | 2012-094866 A | 5/2012 |

(Continued)

*Primary Examiner* — Jimmy Vu
*Assistant Examiner* — Henry Luong
(74) *Attorney, Agent, or Firm* — Muir Patent Law, PLLC

(57) ABSTRACT

A light-emitting device package including: a package substrate; first to fifth conductive patterns disposed on a top surface of the package substrate; a first rectifying circuit disposed on the first and second conductive patterns; a first light-emitting device disposed on the fifth conductive pattern and electrically connected to the first rectifying circuit; a second rectifying circuit disposed on the third and fourth conductive patterns; and a second light-emitting device disposed on the fifth conductive pattern and electrically connected to the second rectifying circuit.

8 Claims, 10 Drawing Sheets

(56) References Cited

U.S. PATENT DOCUMENTS

| | | | |
|---|---|---|---|
| 8,339,050 B2 | 12/2012 | Lee et al. | |
| 8,680,533 B2 | 3/2014 | Sakai et al. | |
| 8,735,911 B2 | 5/2014 | Sakai et al. | |
| 8,735,918 B2 | 5/2014 | Sakai et al. | |
| 2006/0256826 A1 | 11/2006 | Lin et al. | |
| 2011/0193493 A1* | 8/2011 | Chao | 315/294 |
| 2012/0119238 A1 | 5/2012 | Huang et al. | |
| 2012/0217902 A1* | 8/2012 | Yang | H05B 33/0806 315/314 |
| 2012/0235581 A1* | 9/2012 | Chou | H05B 33/0806 315/185 R |
| 2012/0305951 A1 | 12/2012 | Sakai et al. | |
| 2013/0248900 A1 | 9/2013 | Sakai et al. | |

FOREIGN PATENT DOCUMENTS

| | | |
|---|---|---|
| KR | 10-0843402 B1 | 7/2008 |
| KR | 10-2008-0089732 A | 10/2008 |
| KR | 10-2010-0038252 A | 4/2010 |
| KR | 10-1121714 B1 | 2/2012 |
| KR | 10-1142939 B1 | 4/2012 |
| KR | 10-1171293 B1 | 7/2012 |

* cited by examiner

LIGHT-EMITTING DEVICE PACKAGE AND LIGHT-EMITTING APPARATUS

CROSS-REFERENCE TO RELATED APPLICATION

This application claims the benefit of Korean Patent Application No. 10-2013-0027491, filed on Mar. 14, 2013, in the Korean Intellectual Property Office, the disclosure of which is incorporated herein in its entirety by reference.

BACKGROUND

The present disclosure relates to a light-emitting device package and a light-emitting apparatus, and more particularly, to a light-emitting device package and a light-emitting apparatus that directly utilize alternating current power.

Light-emitting diodes (LEDs) are light-emitting devices that convert an electrical signal into light through a PN junction of a compound semiconductor. Accordingly, LEDs are embodied in the form of a package for use in a wide range of applications including interior or exterior illumination devices, headlights for vehicles, back-lights (BLU) for display apparatuses, and medical devices. In general, LEDs are driven by a direct current. Accordingly, to drive LEDs with commercially available alternating current power, for example, additional circuits, such as a rectifying circuit, need to be included in a driving circuit inside or outside an LED package. Due to such additional circuits, the configuration and wiring structure of the LED package is complicated. Also, a light-emitting area in which an LED is disposed is reduced and thus, it is difficult to obtain a desired emission level of light.

SUMMARY

The present disclosure provides a light-emitting device package and a light-emitting apparatus, each of which includes a rectifying circuit with a simplified structure so that a wiring structure can be simplified and an emission area can be widened. Also, the present disclosure provides a configuration which can make it possible to directly drive the light-emitting device package and the light-emitting apparatus with various levels of alternating current power.

According to an aspect of the present disclosure, there is provided a light-emitting device package including: a package substrate; first to fifth conductive patterns disposed on a top surface of the package substrate; a first rectifying circuit disposed on the first and second conductive patterns; a first light-emitting device disposed on the fifth conductive pattern and electrically connected to the first rectifying circuit; a second rectifying circuit disposed on the third and fourth conductive patterns; and a second light-emitting device disposed on the fifth conductive pattern and electrically connected to the second rectifying circuit.

In some embodiments, the first rectifying circuit may include: a first diode including first and second diode elements disposed in a first substrate, the first and second diode elements sharing an electrode; and a second diode including third and fourth diode elements disposed in a second substrate, the third and fourth diode elements sharing an electrode.

In some embodiments, the first diode may include: the first substrate; a first common electrode disposed on a bottom surface of the first substrate and electrically connected to the first light-emitting device; first and second impurity regions that are separated from each other in a top surface of the first substrate and are each doped with a second conductive impurity; and a first electrode disposed on each of the first and second impurity regions, wherein the first diode is defined by a junction of the first impurity region and the first substrate, and the second diode is defined by a junction of the second impurity region and the first substrate.

In some embodiments, the second diode may include: the second substrate; a second common electrode disposed on a bottom surface of the second substrate and electrically connected to the first light-emitting device; third and fourth impurity regions that are separated from each other in a top surface of the second substrate and are each doped with a first conductive impurity; and a second electrode disposed on each of the third and fourth impurity regions, wherein a third diode is defined by a junction of the third impurity region and the second substrate, and a fourth diode is defined by a junction of the fourth impurity region and the second substrate.

In some embodiments, the first diode may be mounted in a flip-chip form on the package substrate such that the first diode element is connected to the second conductive pattern and the second diode element is connected to the first conductive pattern, and the second diode may be mounted in a flip-chip form on the package substrate such that the third diode element is connected to the first conductive pattern and the fourth diode element is connected to the second conductive pattern.

In some embodiments, the first and second light-emitting devices may each include at least one light-emitting device.

According to another aspect of the present disclosure, there is provided a light-emitting apparatus including: a first rectifying circuit configured to receive and rectify power to generate a first driving power; a first light-emitting device configured to receive the first driving power transmitted by the first rectifying circuit to emit light; a second rectifying circuit configured to receive and rectify power to generate a second driving power; and a second light-emitting device configured to receive the second driving power transmitted by the second rectifying circuit to emit light.

In some embodiments, the first rectifying circuit may include: a first diode between a first input node and a first common node; a second diode between the first common node and a second input node; a third diode between the second input node and a second common node; and a fourth diode between the second common node and the first input node, wherein the first and third diodes or the second and fourth diodes provide a transmission path of the power to form the first driving power generated by full-wave rectifying the power.

In some embodiments, the first light-emitting device may include at least one light-emitting device between the first common node and the second common node.

In some embodiments, the second rectifying circuit may include: a fifth diode between a third input node and a third common node; a sixth diode between the third common node and a fourth input node; a seventh diode between the fourth input node and a fourth common node; and an eighth diode between the fourth common node and the third input node, wherein the fifth and seventh diodes or the sixth and eighth diodes provide a transmission path of the power to form the second driving power generated by full-wave rectifying the power.

In some embodiments, the second light-emitting device may include at least one light-emitting device between the third common node and the fourth common node.

In some embodiments, the light-emitting apparatus may further include a first level controller serially connected to the first rectifying circuit and controlling a level of power supplied to the first rectifying circuit; a second level controller serially connected to the second rectifying circuit and controlling a level of power supplied to the second rectifying circuit; and a path controller connected in parallel to the first rectifying circuit and controlling a transmission path of power output by the first level controller and the second level controller, wherein the first rectifying circuit is serially connected to the second rectifying circuit.

In some embodiments, the first level controller may include at least one resistor, the second level controller may include at least one resistor, and the path controller may include at least one capacitor.

In some embodiments, the light-emitting apparatus may further include a phase controller serially connected to the first rectifying circuit and controlling a phase of power supplied to the first rectifying circuit; and a third level controller serially connected to the second rectifying circuit and controlling a level of power supplied to the second rectifying circuit, wherein the first rectifying circuit and the phase controller are connected in parallel to the second rectifying circuit and the third level controller.

In some embodiments, the phase controller may include at least one capacitor, and the third level controller may include at least one resistor.

In some embodiments, the first and second substrates may be conductive substrates.

In some embodiments, the first and second substrates may be insulating substrates.

According to an aspect of the present disclosure, there is provided a light-emitting device including a substrate; a first rectifying circuit disposed on the substrate; a first light-emitting device disposed on the substrate, wherein the first rectifying circuit includes a first diode electrically connected to one end of the first light-emitting device and a second diode electrically connected to another end of the first light-emitting device.

The light-emitting device may further include a second rectifying circuit disposed on the substrate; a second light-emitting device disposed on the substrate, wherein the second rectifying circuit includes a third diode electrically connected to one end of the second light-emitting device and a fourth diode electrically connected to another end of the second light-emitting device, and wherein the first and second rectifying circuits are electrically isolated.

The light-emitting device may further include a second rectifying circuit disposed on the substrate; a second light-emitting device disposed on the substrate, wherein the second rectifying circuit includes a third diode electrically connected to one end of the second light-emitting device and a fourth diode electrically connected to another end of the second light-emitting device, and wherein the first and second rectifying circuits are electrically connected.

BRIEF DESCRIPTION OF THE DRAWINGS

Exemplary embodiments of the present disclosure will be more clearly understood from the following detailed description taken in conjunction with the accompanying drawings in which:

FIG. 1 is a plan view illustrating some structures disposed on a top surface of a package substrate, and FIG. 2 is a plan view illustrating some structures disposed on a bottom surface of the package substrate;

DETAILED DESCRIPTION OF EXEMPLARY EMBODIMENTS

Figure 1:
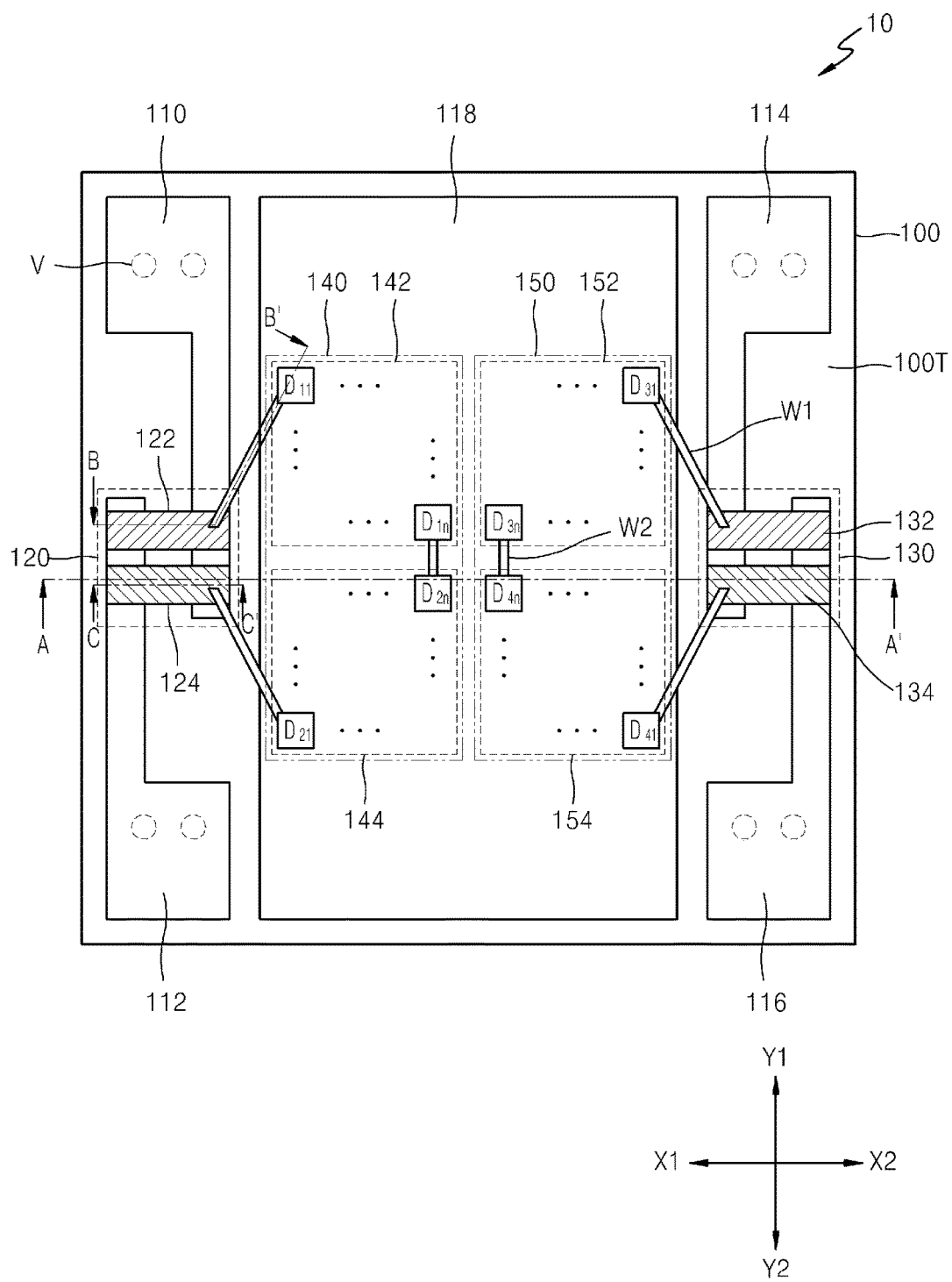
FIGS. 1 and 2 are plan views of a major structure of a light-emitting device package according to exemplary embodiments of the present disclosure.

Hereinafter, exemplary embodiments of the present disclosure will be described in detail with reference to the accompanying drawings. Like reference numerals denote like elements throughout the drawings, and a redundant explanation thereof will be omitted.

Exemplary embodiments of the present disclosure are provided such that this disclosure will be thorough and complete, and will fully convey a scope of the present disclosure to those having ordinary skill in the art. The following exemplary embodiments can be embodied in many different forms and the scope of the present disclosure should not be limited to the following exemplary embodiments described herein.

It will be understood that, although the terms "first," "second," "third," "top," "bottom," etc., may be used herein to describe various elements, components, regions, layers and/or sections, these elements, components, regions, layers and/or sections should not be limited by these terms. These terms do not mean a particular sequence or top and bottom, or superior and inferior, and are used only to distinguish one element, component, region, portion, or constituent from another region, portion, or constituent. Thus, a first element, component, region, portion, or constituent discussed below could be termed a second element, component, region, portion, or constituent without departing from the teachings of the present disclosure. For example, without departing from the teachings of the present disclosure, a first constituent could be termed a second constituent.

Unless otherwise defined, all terms (including technical and scientific terms) used herein have the same meaning as commonly understood by one of ordinary skill in the art of the present disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When some embodiments can be embodied in a different manner, a particular process sequence may be performed in a different manner from what has been described. For example, when a first process is explained and then a second process is explained, the first process may be performed before the second process, the first process and the second process may be performed substantially simultaneously, or the second process may be performed before the first process.

Regarding the drawings, the illustrated shapes may be deformed according to, for example, a manufacturing technique and/or tolerance. Accordingly, exemplary embodiments of the present disclosure should not be interpreted as being limited to a particular shape of a region illustrated in the drawings. Rather, exemplary embodiments of the present disclosure may include, for example, a change in shape resulting from the manufacturing process.

Expressions such as "at least one of," when preceding a list of elements, modify the entire list of elements and do not modify the individual elements of the list.

Figure 2:
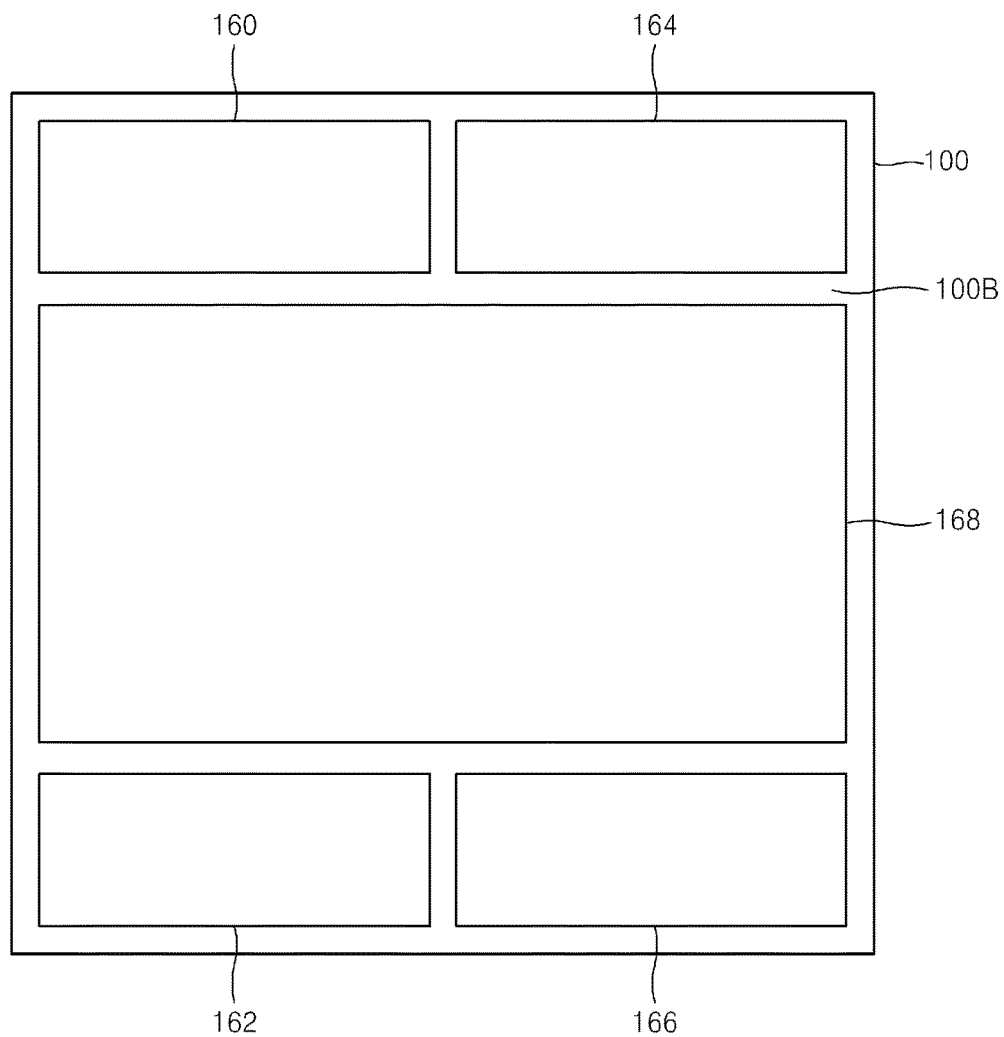

FIGS. 1 and 2 are plan views of a major structure of a light-emitting device package 10 according to an exemplary embodiment of the present disclosure: FIG. 1 is a plan view illustrating some structures disposed on a top surface 100T of a package substrate 100, and FIG. 2 is a plan view illustrating some structures disposed on a bottom surface 100B of the package substrate 100. For convenience, a lens (180 in FIG. 3) is omitted in FIG. 1.

Referring to FIGS. 1 and 2, the light-emitting device package 10 may include first to fifth conductive patterns 110, 112, 114, 116, and 118, a first rectifying circuit 120 a second rectifying circuit 130, a first light-emitting device 140, and a second light-emitting device 150, which are disposed on the top surface 100T of the package substrate 100, and first to fifth bottom conductive patterns 160, 162, 164, 166, and 168 on the bottom surface 100B of the package substrate 100.

On the top surface 100T of the package substrate 100, the fifth conductive pattern 118 may be formed at the center of the top surface 100T, the first and second conductive patterns 110 and 112 may be formed on a side of the fifth conductive pattern 118 in the X1 direction, and the third and fourth conductive patterns 114 and 116 may be formed on another side of the fifth conductive pattern 118 in the X2 direction.

In some embodiments, the fifth conductive pattern 118 may have a rectangular cross-sectional shape having a greater area than that of the first to fourth conductive patterns 110, 112, 114, and 116. The first to fourth conductive patterns 110, 112, 114, and 116 may have a polygonal cross-sectional shape. For example, the first to fourth conductive patterns 110, 112, 114, and 116 may have a '⌐' cross-sectional shape. However, the cross-sectional shapes of the first to fourth conductive patterns 110, 112, 114, and 116 are not limited thereto, and may vary.

The first and second conductive patterns 110 and 112 may be disposed to face each other and may overlap with the first rectifying circuit 120. Likewise, the third and fourth conductive patterns 114 and 116 may be disposed to face each other and may overlap with the second rectifying circuit 130.

On the bottom surface 100B of the package substrate 100, the fifth bottom conductive pattern 168 may be formed at the center of the bottom surface 100B, and the first and third bottom conductive patterns 160 and 164 may be formed on a side of the fifth bottom conductive pattern 168 in the Y1 direction, and the second and fourth bottom conductive patterns 162 and 166 may be formed on another side of the fifth conductive pattern 168 in the Y2 direction.

In some embodiments, the first to fifth bottom conductive patterns 160, 162, 164, 166, and 168 may have rectangular cross-sectional shapes. The first to fourth bottom conductive patterns 160, 162, 164, and 166 may have rectangular cross-sectional shapes having identical areas, and the fifth bottom conductive pattern 168 may have a rectangular cross-sectional shape having a greater area than that of the first to fourth bottom conductive patterns 160, 162, 164, and 166.

In some embodiments, the first and third bottom conductive patterns 160 and 164 may contact each other, and the second and fourth bottom conductive patterns 162 and 166 may contact each other. For example, as described later, when the first rectifying circuit 120 and the second rectifying circuit 130 need to be electrically connected to each other according to a level of an applied voltage (see FIGS. 8 and 10), the first and third bottom conductive patterns 160 and 164 may contact each other, or the second and fourth bottom conductive patterns 162 and 166 may contact each other.

The first to fourth bottom conductive patterns 160, 162, 164, and 166 may be, respectively, electrically connected to the first to fourth conductive patterns 110, 112, 114, and 116 through at least one through-hole electrode V formed through the package substrate 100. Accordingly, the first to fourth bottom conductive patterns 160, 162, 164, and 166 may be connected to an external apparatus (not shown) for the application of predetermined power in various manners to transmit the applied power to the first and second rectifying circuits 120 and 130 through the first to fourth conductive patterns 110, 112, 114, and 116.

The first rectifying circuit 120 may be disposed on the first and second conductive patterns 110 and 112 on the side of the top surface 100T of the package substrate 100 in the X1 direction. The first light-emitting device 140 may be disposed on the fifth conductive pattern 118. The first rectifying circuit 120 may be electrically connected to the first light-emitting device 140 disposed on the fifth conductive pattern 118.

The first rectifying circuit 120 may include a first diode 122 and a second diode 124. Each of the first diode 122 and the second diode 124 may include at least two or more diodes that are formed on a substrate and share an electrode.

In some embodiments, the first diode 122 may include at least two or more diodes defined as a PN junction due to at least two or more impurity regions (not shown) being formed by doping a first conductive N-type substrate (not shown) with a second conductive P-type impurity. In this regard, diodes of the first diode 122 may share an N-type electrode.

In some embodiments, the second diode 124 may include at least two or more diodes defined as a PN junction due to at least two or more impurity regions (not shown) formed by doping a second conductive P-type substrate (not shown) with a first conductive N-type impurity. In this regard, diodes of the second diode 124 may share a P-type electrode. The first and second diodes 122 and 124 will be described in further detail in connection with FIGS. 4 and 5.

In each of the first and second diodes 122 and 124, diodes share an electrode, and the diodes of the first diode 122 are electrically connected to the diodes of the second diode 124 through the first and second conductive patterns 110 and 112. By doing so, the first rectifying circuit 120 may perform as a bridge rectifying circuit. Accordingly, the first rectifying circuit 120 may full-wave rectify alternating current power applied through the first and second conductive patterns 110 and 112 to output the rectified power to the first light-emitting device 140.

The first light-emitting device 140 may include a first light-emitting device region 142 and a second light-emitting device region 144. Each of the first and second light-emitting device regions 142 and 144 may include at least one light-emitting device. In some embodiments, the first and second light-emitting device regions 142 and 144 may include n (n is a natural number) light-emitting devices D11 to D1n and D21 to D2n, respectively. However, the present exemplary embodiment is not limited thereto, and the first and second light-emitting device regions 142 and 144 may include different numbers of light-emitting devices.

In some embodiments, the light-emitting devices D11 to D1n of the first light-emitting device region 142 may be aligned such that the light-emitting devices D11 to D1n are serially connected to each other to form a current path. However, the present exemplary embodiment is not limited thereto, and the light-emitting devices D11 to D1n of the first light-emitting device region 142 may be aligned such that the light-emitting devices D11 to D1n are serially connected to each other in a group, and a plurality of the groups are connected in parallel to form a plurality of current paths. Likewise, the light-emitting devices D21 to D2n of the second light-emitting device region 144 may be aligned such that the light-emitting devices D21 to D2n are serially connected to each other, but the alignment structure of the light-emitting devices D21 to D2n is not limited thereto, as described in further detail below in connection with FIG. 6.

In some embodiments, the light-emitting devices D11 to D1n of the first light-emitting device region 142 may be electrically connected to the light-emitting devices D21 to D2n of the second light-emitting device region 144. That is, the light-emitting device D1n of the first light-emitting device region 142 may be electrically connected to the light-emitting device D2n of the second light-emitting device region 144 through a connection member, for example, a wire W2, and thus, the serially connected light-emitting devices D11 to D1n of the first light-emitting device region 142 may be serially connected to the serially connected light-emitting devices D21 to D2n of the second light-emitting device region 144, respectively. However, the present exemplary embodiment is not limited thereto. For example, the light-emitting device D1n of the first light-emitting device region 142 may be electrically connected to the light-emitting device D2n of the second light-emitting device region 144 through a pattern (not shown) formed on the fifth conductive pattern 118.

The first rectifying circuit 120 may be electrically connected to the first light-emitting device 140 through a connection member, for example, a wire W1. In some embodiments, the first diode 122 of the first rectifying circuit 120 may be electrically connected to the light-emitting device D11 of the first light-emitting device region 142, and the second diode 124 of the first rectifying circuit 120 may be electrically connected to the light-emitting device D21 of the second light-emitting device region 144. Accordingly, the first rectifying circuit 120 rectifies power, for example, alternating current power, which is provided through the first and second conductive patterns 110 and 112, and may transmit the rectified power to the serially connected light-emitting devices D11 to D1n and D21 to D2n of the first light-emitting device 140. The light-emitting devices D11 to D1n and D21 to D2n of the first light-emitting device 140 may respond to a driving power, for example, a direct current transmitted from the first rectifying circuit 120, to emit light.

The second rectifying circuit 130 may be disposed on the third and fourth conductive patterns 114 and 116 on another side of the top surface 100T of the package substrate 100 in the X2 direction. The second light-emitting device 150 may be further disposed on the fifth conductive pattern 118. The second rectifying circuit 130 may be electrically connected to the second light-emitting device 150 disposed on the fifth conductive pattern 118.

The second rectifying circuit 130 may include a third diode 132 and a fourth diode 134. The third diode 132 and the fourth diode 134 may be substantially the same as the first diode 122 and the second diode 124, respectively. That is, the third diode 132 may include at least two or more diodes that are formed on a substrate and share an N-type electrode, and the fourth diode 134 may include at least two or more diodes that are formed on a substrate and share a P-type electrode.

Like the first rectifying circuit 120, in each of the third and fourth diodes 132 and 134, diodes share an electrode, and the diodes of the third diode 132 are electrically connected to the diodes of the fourth diode 134 through the third and fourth conductive patterns 114 and 116. By doing so, the second rectifying circuit 130 may perform as a bridge rectifying circuit. Accordingly, the second rectifying circuit 130 may full-wave rectify alternating current power applied through the third and fourth conductive patterns 114 and 116 to output the rectified power to the second light-emitting device 150.

The second light-emitting device 150 may include a third light-emitting device region 152 and a fourth light-emitting device region 154. The third light-emitting device region 152 and the fourth light-emitting device region 154 may be electrically connected to each other.

The third light-emitting device region 152 and the fourth light-emitting device region 154 may have substantially the same structure as those of the first light-emitting device region 142 and the second light-emitting device region 144, respectively. That is, the third and fourth light-emitting device regions 152 and 154 may respectively include n (n is a natural number) light-emitting devices D31 to D3n which are serially connected to each other and D41 to D4n which are serially connected to each other. The light-emitting device D3n of the third light-emitting device region 152 may be electrically connected to the light-emitting device D4n of the fourth light-emitting device region 154 through a connection member, for example, a wire W2, so that the light-emitting devices D31 to D3n and D41 to D4n may form a single current path.

The second rectifying circuit 130 and the second light-emitting device 150 may be, like the first rectifying circuit 120 and the first light-emitting device 140, electrically connected to each other through a connection member, for example, a wire W1. Accordingly, the second rectifying circuit 130 rectifies power, for example, alternating current power, which is provided through the third and fourth conductive patterns 114 and 116, and may transmit the rectified power to the serially connected light-emitting devices D31 to D3n and D41 to D4n of the second light-emitting device 150. The light-emitting devices D31 to D3n and D41 to D4n of the second light-emitting device 150 may respond to a driving power, for example, a direct current transmitted from the second rectifying circuit 130, to emit light.

As described above, in the light-emitting device package 10 according to the present exemplary embodiment of the present disclosure, light-emitting devices of the first and second light-emitting devices 140 and 150 are independently driven in correspondence with the first and second rectifying circuits 120 and 130, respectively.

Figure 3:
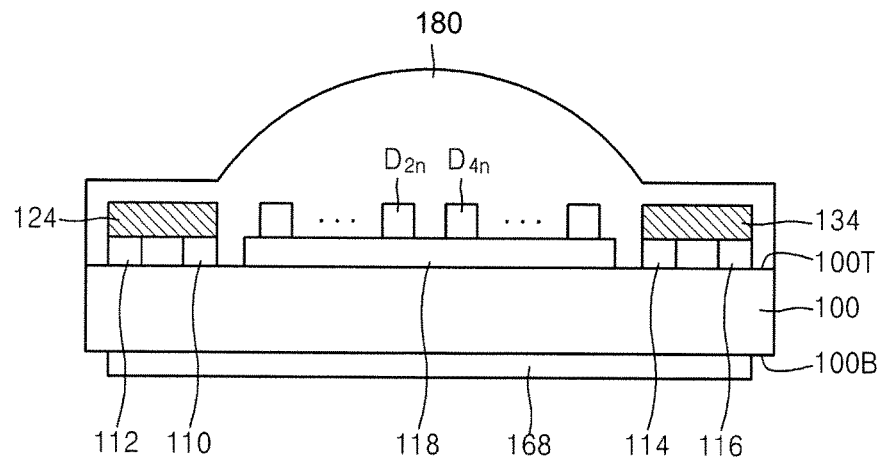
FIG. 3 is a cross-sectional view taken along line A-A' of the light-emitting device package of FIG. 1.

FIG. 3 is a cross-sectional view taken along line A-A' of the light-emitting device package 10 of FIG. 1. In FIG. 3 and FIGS. 1 and 2, like reference numerals indicate like members, and a redundant explanation thereof will be omitted herein for purposes of brevity.

Referring to FIGS. 1 to 3, the first to fifth conductive patterns 110, 112, 114, 116, and 118 may be separately formed on the top surface 100T of the package substrate 100, and the fifth bottom conductive pattern 168 may be formed on the bottom surface 100B of the package substrate 100.

In some embodiments, the package substrate 100 may be an insulating substrate. For example, the package substrate 100 may be a silicon substrate, a ceramic substrate, an aluminum nitride (AlN) substrate, a sapphire ($Al_2O_3$) substrate, or an $FR_4$ substrate.

In some embodiments, the first to fifth conductive patterns 110, 112, 114, 116, and 118, and the fifth bottom conductive pattern 168 may each be formed of a metal film that has excellent electric conductivity and enables a junction. The metal film may include, for example, at least one of Cu, Au, Ag, Al, Ni, and Cr. Although not illustrated in FIG. 3, the first to fourth bottom conductive patterns 160, 162, 164, and 166 may each be formed of a metal film as described above.

The second diode 124 may be disposed on the first and second conductive patterns 110 and 112, and the fourth diode 134 may be disposed on the third and fourth conductive patterns 114 and 116. The light-emitting devices D21 to D2$n$ of the second light-emitting device region 144 and the light-emitting devices D41 to D4$n$ of the fourth light-emitting device region 154 may be disposed on the fifth conductive pattern 118.

In some embodiments, the light-emitting devices D21 to D2$n$ and D41 to D4$n$ may have a horizontal electrode structure, a vertical electrode structure, or a vertical and horizontal electrode structure.

A lens 180 may be disposed on the package substrate 100 in such a manner that the lens 180 covers the top surface 100T of the package substrate 100 and surrounds the first diode 124, the third diode 134, and the light-emitting devices D21 to D2$n$ and D41 to D4$n$.

In some embodiments, an inside of the lens 180 may be filled with a silicon resin, an epoxy resin, plastic, or glass. In other alternative embodiments, the inside of the lens 180 may include a refraction member (not shown). The refraction member may refract or reflect light emitted from the light-emitting devices D21 to D2$n$ and D41 to D4$n$. In other embodiments, the lens 180 may include a fluorescent substance (not shown). The fluorescent substance may include at least one of a yellow fluorescent substance, a green fluorescent substance, a red fluorescent substance, and a blue fluorescent substance.

Figure 4:
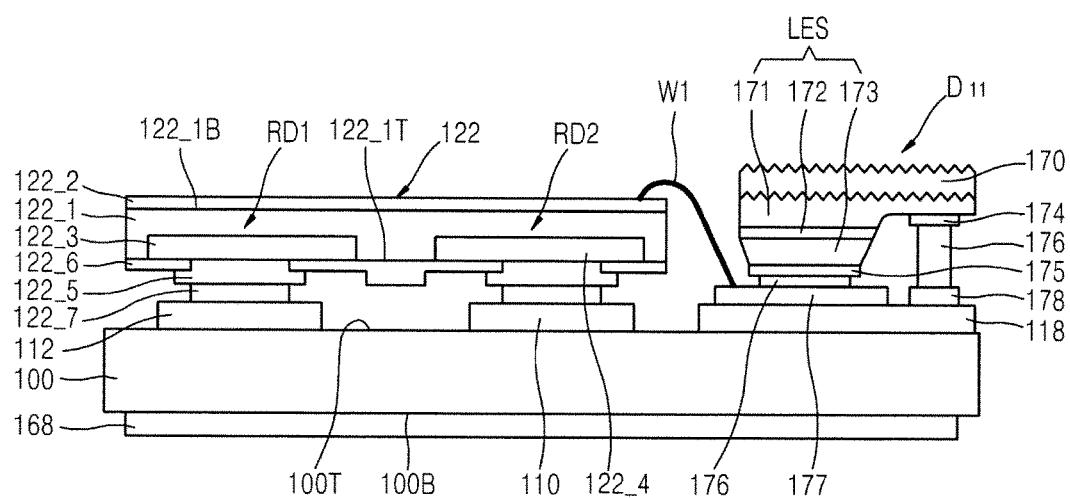
FIG. 4 is a cross-sectional view taken along line B-B' of the light-emitting device package of FIG. 1.

FIG. 4 is a cross-sectional view taken along line B-B' of the light-emitting device package 10 of FIG. 1. In FIG. 4 and FIGS. 1 through 3, like reference numerals indicate like members, and a redundant explanation thereof will be omitted herein for purposes of brevity. Hereinafter, an explanation will be made of the first diode 122 and the light-emitting device D11. The light-emitting device D11 illustrated in FIG. 4 has a horizontal electrode structure and is mounted in a flip-chip form on the package substrate 100. However, the light-emitting device D11 is not limited to the illustrated structure. For example, the light-emitting device D11 may have a vertical electrode structure or a vertical and horizontal electrode structure, and may be mounted in various manners on the package substrate 100.

Referring to FIGS. 1 to 4, the first diode 122 may include a first substrate 122_1. In some embodiments, the first substrate 122_1 may be an insulating substrate, or in other embodiments a conductive substrate formed of silicon or silicon carbide gallium nitride of which at least a portion is doped with a first conductive impurity, for example, an N-type impurity.

A first common electrode 122_2 may be formed on a bottom surface 122_1B of the first substrate 122_1. In some embodiments, the first common electrode 122_2 may be formed of a metal film with excellent electrical conductivity. The metal film may include, for example, at least one of Cu, Au, Ag, Al, Ni, and Cr.

The first substrate 122_1 may have first and second impurity regions 122_3 and 122_4 which are separated from each other. Each of the first and second impurity regions 122_3 and 122_4e extend from a top surface 122_1T of the first substrate 122_1 to respective depths. In some embodiments, each of the first and second impurity regions 122_3 and 122_4 may be a region doped with a second conductive impurity, for example, a P-type impurity. Accordingly, a PN junction formed by the first impurity region 122_3 and the first substrate 122_1 defines a first diode element RD1, and a PN junction formed by the second impurity region 122_4 and the first substrate 122_1 defines a second diode element RD2.

A first electrode 122_5 may be formed on each of the first and second impurity regions 122_3 and 122_4, and the first electrodes 122_5 may be spaced apart from each other with an insulating film 122_6 disposed therebetween. In some embodiments, the first electrodes 122_5 have excellent electrical conductivity, and may be formed of a metal film that enables a junction with the first and second conductive patterns 110 and 112. The metal film may include, for example, at least one of Cu, Ag, Al, Ni, Cr, V, Au, Sn, Pb, Ag, In, Ge, and Si. In some embodiments, the insulating film 122_6 may be formed of an insulating material, for example, at least one of silicon oxide, silicon nitride, and silicon oxynitride.

As described above, the first diode 122 may include the first diode element RD1 and the second diode element RD2 which are formed in the first substrate 122_1 and share the first common electrode 122_2.

In the first diode 122, the top surface 122_1T of the first substrate 122_1 faces the top surface 100T of the package substrate 100 such that the first electrodes 122_5 are mounted in a flip-chip form on the package substrate 100 so that the first electrodes 122_5 form a junction with the first and second conductive patterns 110 and 112. A junction member 122_7, for example, solder, may be disposed between the first electrode 122_5 on the first diode element RD1 and the second conductive pattern 112, and between the first electrode 122_5 on the second diode element RD2 and the first conductive pattern 110.

The light-emitting device D11 may include a light-emitting structure LES including a first semiconductor layer 171, an emission layer 172, and a second semiconductor layer 173 that are sequentially stacked in this order on a surface of a growth substrate 170. In some embodiments, another surface of the growth substrate 170, which is opposite to the surface on which the light-emitting structure LES is formed, may have an uneven structure having a roughness. In some embodiments, the first semiconductor layer 171, the emission layer 172, and the second semiconductor layer 173 may include a Group III nitride semiconductor.

The light-emitting device D11 may include a first electrode pad 174 formed on an exposed portion of the first semiconductor layer 171, and a second electrode pad 175 formed on the second semiconductor layer 173. In some embodiments, the first electrode pad 174 and the second electrode pad 175 may include at least one selected from an indium tin oxide (ITO), Cu, Ni, Cr, Au, Ti, Pt, Al, V, W, Mo, and Ag.

First and second bonding patterns 177 and 178 may be formed on the fifth conductive pattern 118 in correspondence with the second and first electrode pads 175 and 174, respectively In the light-emitting device D11, the second and first electrode pads 175 and 174 may be mounted in a flip-chip form on the package substrate 100 so that the second and first electrode pads 175 and 174 form a junction with the first and second bonding patterns 177 and 178, respectively, through a junction member 176, for example, solder.

The first common electrode 122_2 of the first diode 122 may be electrically connected to the first bonding pattern 177 through a connection member, for example, the wire W1, and due to the connection, the first diode 122 may be electrically connected to the light-emitting device D11.

Figure 5:
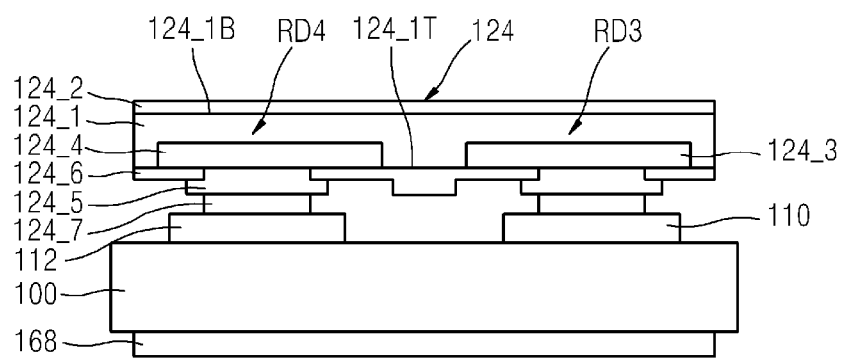
FIG. 5 is a cross-sectional view taken along line C-C' of the light-emitting device package of FIG. 1.

FIG. 5 is a cross-sectional view taken along line C-C' of the light-emitting device package 10 of FIG. 1. In FIG. 5 and FIGS. 1 through 4, identical or corresponding reference numerals indicate identical or corresponding members, and a redundant explanation thereof will be omitted herein for purposes of brevity. Hereinafter, an explanation will be made of the second diode 124.

Referring to FIGS. 1 to 5, the second diode 124 may include a second substrate 124_1. In some embodiments, the second substrate 124_1 may be an insulating substrate, or in other embodiments a conductive substrate of which at least a portion is doped with a second conductive impurity, for example, a P-type impurity.

A second common electrode 124_2 may be formed on a bottom surface 124_1B of the second substrate 124_1. The second common electrode 124_2 may be formed of materials similar to or identical with those described in connection with the first common electrode 122_2.

The second substrate 124_1 may have third and fourth impurity regions 124_3 and 124_4 which are separated from each other. Each of the third and fourth impurity regions 124_3 and 124_4 extend from a top surface 124_1T of the second substrate 124_1 to respective depths. In some embodiments, each of the third and fourth impurity regions 124_3 and 124_4 may be a region doped with a first conductive impurity, for example, an N-type impurity. Accordingly, a PN junction formed by the third impurity region 124_3 and the second substrate 124_1 defines a third diode element RD3, and a PN junction formed by the fourth impurity region 124_4 and the second substrate 124_1 defines a fourth diode element RD4.

A second electrode 124_5 may be formed on each of the third and fourth impurity regions 124_3 and 124_4, and the second electrodes 124_5 may be spaced apart from each other with an insulating film 124_6 disposed therebetween. The second electrodes 124_5 and the insulating film 124_6 may be formed of materials similar to or identical with those described above as exemplary materials of the first electrodes 122_5 and the insulating film 122_6, respectively.

Thus, the second diode 124 may be constructed as a single device such that the third diode element RD3 and the fourth diode element RD4 are disposed inside the second substrate 124_1 and share the second common electrode 124_2.

In the second diode 124, the top surface 124_1T of the second substrate 124_1 faces the top surface 100T of the package substrate 100 such that the second electrodes 124_5 are mounted in a flip-chip form on the package substrate 100 so that the second electrodes 124_5 form a junction with the first and second conductive patterns 110 and 112. A junction member 124_7, for example, solder, may be disposed between the second electrode 124_5 on the third diode element RD3 and the first conductive pattern 110, and between the second electrode 124_5 on the fourth diode element RD4 and the second conductive pattern 112.

Although not illustrated in FIG. 5, similarly to the manner by which the first diode 122 and the light-emitting device D11 illustrated in FIG. 4 are connected, the second common electrode 124_2 of the second diode 124 may be electrically connected to the light-emitting device D21.

As described in connection with FIGS. 4 and 5, in the first rectifying circuit 120, the second diode element RD2 and the third diode element RD3 are connected to the first conductive pattern 110, the first diode element RD1 and the fourth diode element RD4 are connected to the second conductive pattern 112, the first diode element RD1 and the second diode element RD2 share the first common electrode 122_2, and the third diode element RD3 and the fourth diode element RD4 share the second common electrode 124_2. By doing so, the first rectifying circuit 120 may perform as a bridge rectifying circuit.

Also, since the third and fourth diodes 132 and 134 of the second rectifying circuit 130 have substantially the same structure as the first and second diodes 122 and 124, the second rectifying circuit 130 may also perform as a bridge rectifying circuit.

As described above, according to the present exemplary embodiment, to directly drive light-emitting devices by using alternating current power, the first rectifying circuit 120 and the second rectifying circuit 130 may each use only two diodes to embody a bridge rectifying circuit, instead of four independent diode devices in a package. Accordingly, the amount of area taken by a rectifying circuit may be decreased.

By doing so, the total size of the light-emitting device package 10 may be minimized, and an available area for light-emitting devices in the package substrate 100 may be relatively increased, thereby guaranteeing an output of the light-emitting device package 10. Also, compared to a configuration in which four independent diode devices are separately electrically connected through a wire bonding, a wiring according to the present disclosure may be more easily arranged to prevent defects in a manufacturing process of the light-emitting device package 10 and to simplify the manufacturing process of the light-emitting device package 10.

Figure 6:
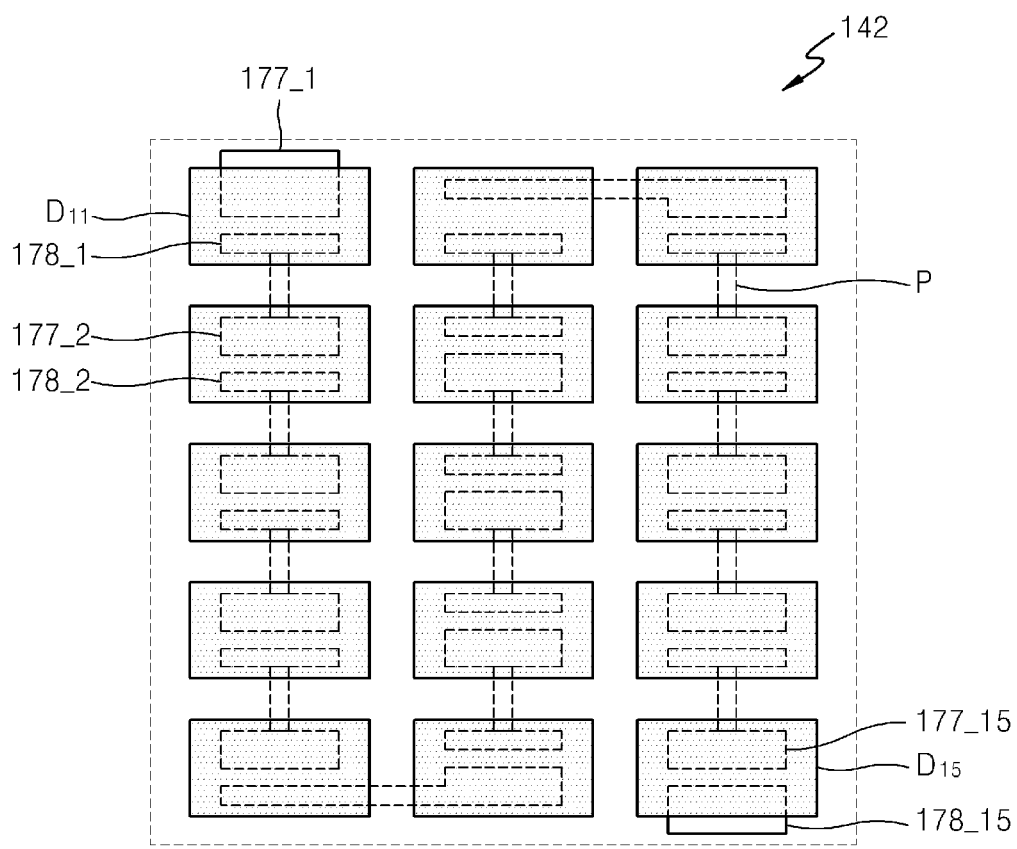
FIG. 6 is a plan view of some structures of a first light-emitting device of the light-emitting device package of FIG. 1.

FIG. 6 is a plan view of some structures of the first light-emitting device 140 of the light-emitting device package 10 of FIG. 1, illustrating an example of a serial connection method of light-emitting devices D11 to D15 in the first light-emitting device region 142 of the first light-emitting device 140. In FIG. 6 and FIGS. 1 through 5, like reference numerals indicate like members, and a redundant explanation thereof will be omitted herein for purposes of brevity. The first light-emitting device region 142 illustrated in FIG. 6 includes 15 light-emitting devices. However, the first light-emitting device region 142 is not limited thereto.

Referring to FIGS. 1 to 6, the first and second bonding patterns 177 and 178 may be formed to respectively correspond to the light-emitting devices D11 to D15, which are mounted in a flip-chip form on the fifth conductive pattern 118 on the first light-emitting device region 142.

The first and second bonding patterns 177 and 178 respectively contact electrode pads of the light-emitting devices D11 to D15, and may have various shapes according to the mounting method of the light-emitting devices D11 to D15.

The light-emitting devices D11 to D15 may be serially connected to each other by connecting a first bonding pattern to a second bonding pattern which are connected to electrode pads of different light-emitting devices, for example, connecting a first bonding pattern 177_2 to a second bonding pattern 178_1 through a conductive pattern P. Also, a first bonding pattern 177_1 of the light-emitting device D11 may be electrically connected to the first rectifying circuit 120 through the wire W1, and a second bonding pattern 178_15 of the light-emitting device D15 may be electrically connected to a light-emitting device of the second light-emitting device region 144 through the wire W2 (FIG. 1).

Although not illustrated in FIG. 6, light-emitting devices of the second to fourth light-emitting device regions 144, 152, and 154 may be connected in a manner similar to those of the first light-emitting device region 142.

Figure 7:
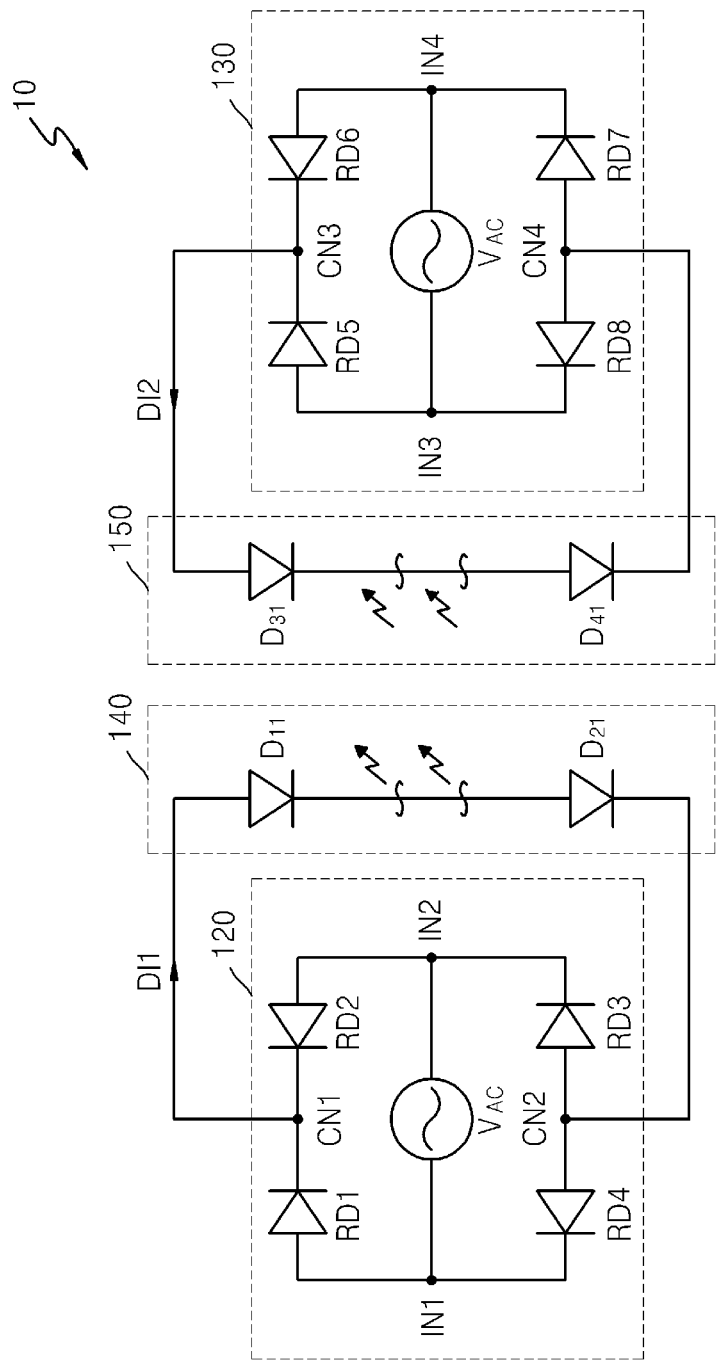
FIG. 7 is a circuit diagram schematically illustrating an electrical connection state between some structures of the light-emitting device package of FIG. 1.

FIG. 7 is a circuit diagram schematically illustrating an electrical connection state between some structures of the light-emitting device package 10 of FIG. 1. In FIG. 7 and FIG. 1, like reference numerals indicate like members, and a redundant explanation thereof will be omitted herein for purpose of brevity; and the first rectifying circuit 120, the second rectifying circuit 130, the first light-emitting device 140, and the second light-emitting device 150 will be described as a circuit. In the light-emitting device package 10 of FIG. 7, the first and second rectifying circuits 120 and 130 are connected in parallel to a power source.

Referring to FIGS. 1 and 7, the first rectifying circuit 120 receives power $V_{AC}$, for example, 100 V to 120 V level of an alternating current, which is supplied by the power source to generate a first driving power DI1, for example, a direct current.

The first rectifying circuit 120 may include a first diode element RD1 between a first input node IN1 and a first common node CN1, a second diode element RD2 between the first common node CN1 and a second input node IN2, a third diode element RD3 between the second input node IN2 and a second common node CN2, and a fourth diode element RD4 between the second common node CN2 and the first input node IN1. Also, although in FIG. 7 one diode is shown between adjacent nodes, according to reverse voltage characteristics, at least two or more diodes may be disposed between adjacent nodes.

In the first rectifying circuit 120, depending on a direction of the power $V_{AC}$ applied between the first input node IN1 and the second input node IN2, the first diode element RD1 and the third diode element RD3 may be turned on, or, the second diode element RD2 and the fourth diode element RD4 may be turned on. Thus, a first driving power DI1 formed by full-wave rectifying the power $V_{AC}$ may be output to the first light-emitting device 140.

The first light-emitting device 140 may receive the first driving power DI1 to emit light. The first light-emitting device 140 may include light-emitting devices D11 to D21, which are serially connected to each other.

The second rectifying circuit 130 receives power $V_{AC}$ to generate a second driving power DI2.

The second rectifying circuit 130 may include a fifth diode element RD5 between a third input node IN3 and a third common node CN3, a sixth diode element RD6 between the third common node CN3 and a fourth input node IN4, a seventh diode element RD7 between the fourth input node IN4 and a fourth common node CN4, and an eighth diode element RD8 between the fourth common node CN4 and the third input node IN3. In some embodiments, according to reverse voltage characteristics, at least two or more diodes may be disposed between adjacent nodes.

In the second rectifying circuit 130, depending on a direction of the power $V_{AC}$ applied between the third input node IN3 and the fourth input node IN4, the fifth diode element RD5 and the seventh diode element RD7 may be turned on, or, the sixth diode element RD6 and the eighth diode element RD8 may be turned on. Thus, a second driving power DI2 formed by full-wave rectifying the power $V_{AC}$ may be output to the second light-emitting device 150.

The second light-emitting device 150 may receive the second driving power DI2 to emit light. The second light-emitting device 150 may include light-emitting devices D31 to D41, which are serially connected to each other.

As illustrated in FIG. 7, in the light-emitting device package 10 according to an exemplary embodiment of the present disclosure, the light-emitting devices D11 to D21 of the first light-emitting device 140 and the light-emitting devices D31 to D41 of the second light-emitting device 150 may be independently driven by the respective first and second driving powers DI1 and DI2 output by the first and second rectifying circuits 120 and 130, respectively, which are connected in parallel to the power source.

Unlike the structure illustrated in FIG. 7, when the first and second rectifying circuits 120 and 130 are serially connected to the power source, in a light-emitting device package 10 according to an exemplary embodiment of the present disclosure, the light-emitting devices D11 to D21 of the first light-emitting device 140 and the light-emitting devices D31 to D41 of the second light-emitting device 150 may be driven by the same driving power output by the first and second rectifying circuits 120 and 130. In this regard, the power source may provide 220V to 240V of the power $V_{AC}$ to the first and second rectifying circuits 120 and 130.

As described above, the light-emitting device package 10 according to an exemplary embodiment of the present disclosure includes two rectifying circuits that are each connected to a light-emitting device, wherein the two rectifying circuits are connected in series or parallel to the power source to directly use various levels of alternating current power to drive the light-emitting device package 10.

Figure 8:
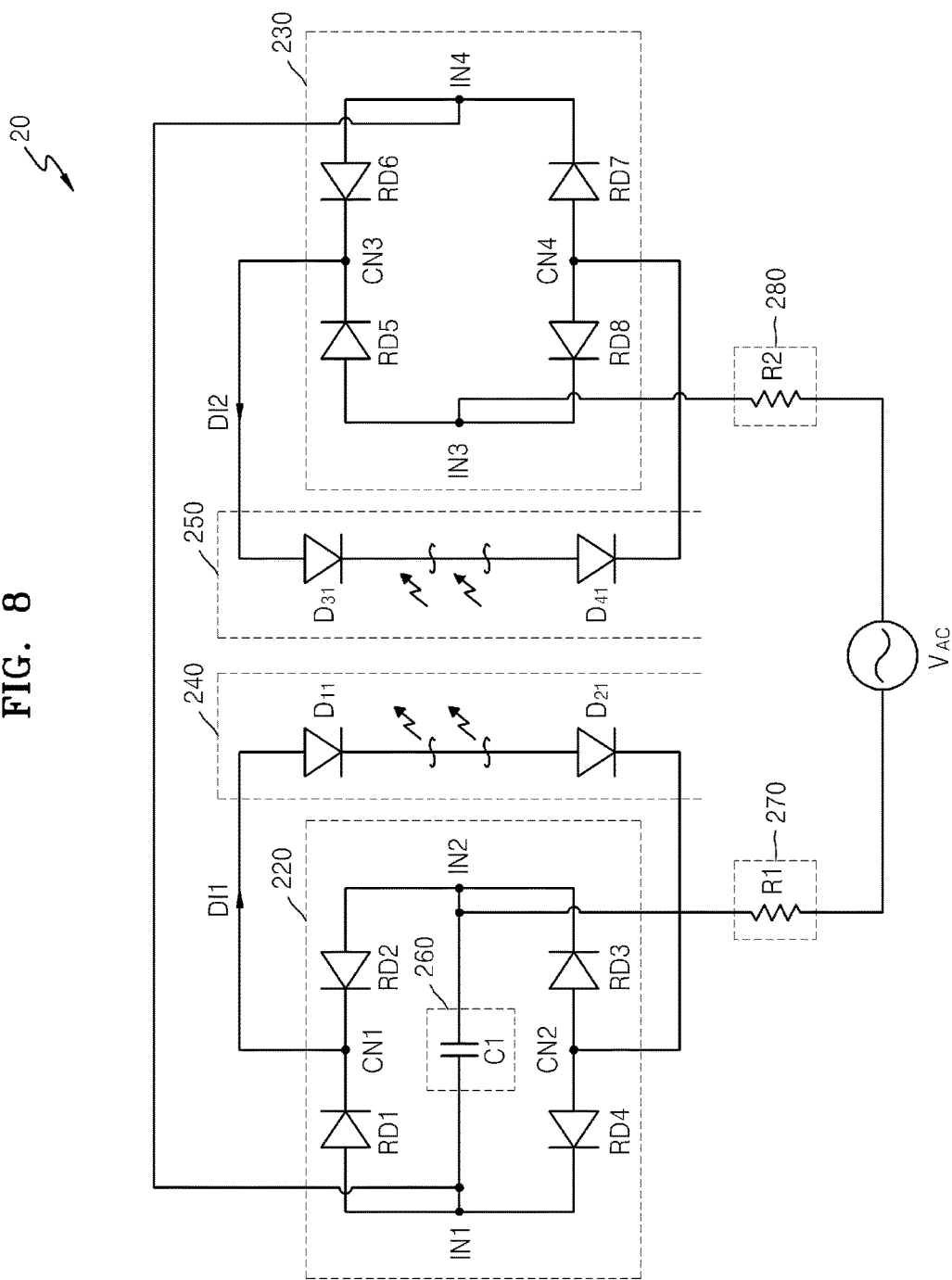
FIG. 8 is a circuit diagram schematically illustrating an electrical connection state between major structures of light-emitting apparatuses according to some exemplary embodiments of the present disclosure.
Figure 9:
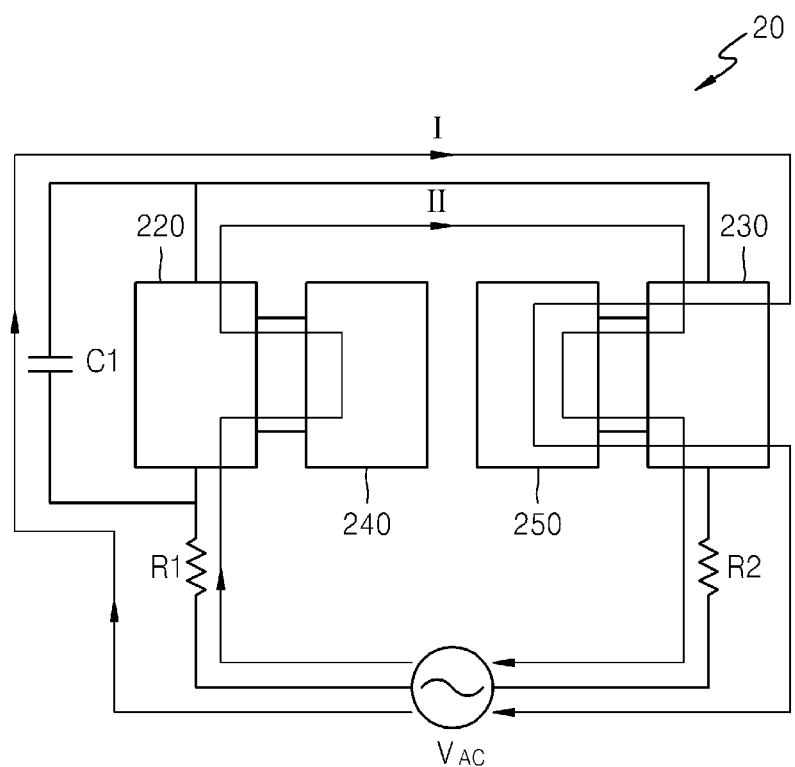
FIG. 9 is a view explaining an example of a current loop that is formed when a light-emitting apparatus of FIG. 8 is driven.

FIG. 8 is a circuit diagram schematically illustrating an electrical connection state between major structures of a light-emitting apparatus 20 according to some exemplary embodiments of the present disclosure. FIG. 9 is a view explaining an example of a current loop that is formed when the light-emitting apparatus 20 of FIG. 8 is driven. In FIGS. 8-9 and FIG. 7, identical or corresponding reference numerals indicate identical or corresponding members, and a redundant explanation thereof will be omitted herein for purposes of brevity. Hereinafter, an explanation will be made of differences therebetween.

The light-emitting apparatus 20 may include a first rectifying circuit 220, a second rectifying circuit 230, a first light-emitting device 240, a second light-emitting device 250, a path controller 260, a first level controller 270, and a second level controller 280. The light-emitting apparatus 20 may be driven by, for example, a power source which provides 220V to 240V of power $V_{AC}$.

The first rectifying circuit 220 may be serially connected to the second rectifying circuit 230. In detail, a second input node IN2 of the first rectifying circuit 220 may be connected to a third input node IN3 of the second rectifying circuit 230 through the power source, and a first input node IN1 of the first rectifying circuit 220 may be electrically connected to a fourth input node IN4 of the second rectifying circuit 230 such that the first rectifying circuit 220 may be serially connected to the second rectifying circuit 230.

The path controller 260 may be connected in parallel to the first rectifying circuit 220. In detail, the path controller 260 may be connected between the first input node IN1 and the second input node IN2 of the first rectifying circuit 220. In some embodiments, the path controller 260 may include a capacitor C1. However, the present disclosure is not limited thereto, and according to an impedance level, the path controller 260 may further include a passive device, for example, a resistor or a capacitor.

The path controller 260 may control a path of the power $V_{AC}$ such that the power $V_{AC}$ is not transmitted to the second rectifying circuit 230 only through the first rectifying circuit 220. For example, when an impedance level of the path controller 260 is much lower than an impedance level of the first rectifying circuit 220, the path controller 260 may control a path of the power $V_{AC}$ such that most of the power $V_{AC}$ transmitted to the second rectifying circuit 230 is through the path controller 260.

By doing so, as illustrated in FIG. 9, the light-emitting apparatus 20 may have a current loop I in which the path controller 260 controls the power $V_{AC}$ and a current loop II in which the first rectifying circuit 220 controls the power $V_{AC}$.

As described above, since the path controller 260 is further included to additionally provide the current loop I, the light-emitting apparatus 20 may control the level and phase of a total output current $I_{OT}$ of the light-emitting devices, as described below in connection with FIG. 12.

The first level controller 270 may be serially connected to the first rectifying circuit 220. In detail, the first level controller 270 may be connected in series between the power source and the second input node IN2 of the first rectifying circuit 220. In some embodiments, the first level controller 270 may include a resistor R1, but it is not limited thereto.

The second level controller 280 may be serially connected to the second rectifying circuit 230. In detail, the second level controller 280 may be connected in series between the power source and the third input node IN3 of the second rectifying circuit 230. In some embodiments, the second level controller 280 may include a resistor R2, but it is not limited thereto.

The first and second level controllers 270 and 280 may control a level of the power $V_{AC}$. In some embodiments, the first level controller 270 and the second level controller 280 may drop the level of the power $V_{AC}$.

Also, although the light-emitting apparatus 20 illustrated in FIGS. 8 and 9 includes the first and second level controllers 270 and 280, the present exemplary embodiment is not limited thereto. For example, the light-emitting apparatus 20 may include only one of the first and the second level controllers 270 and 280.

Figure 10:
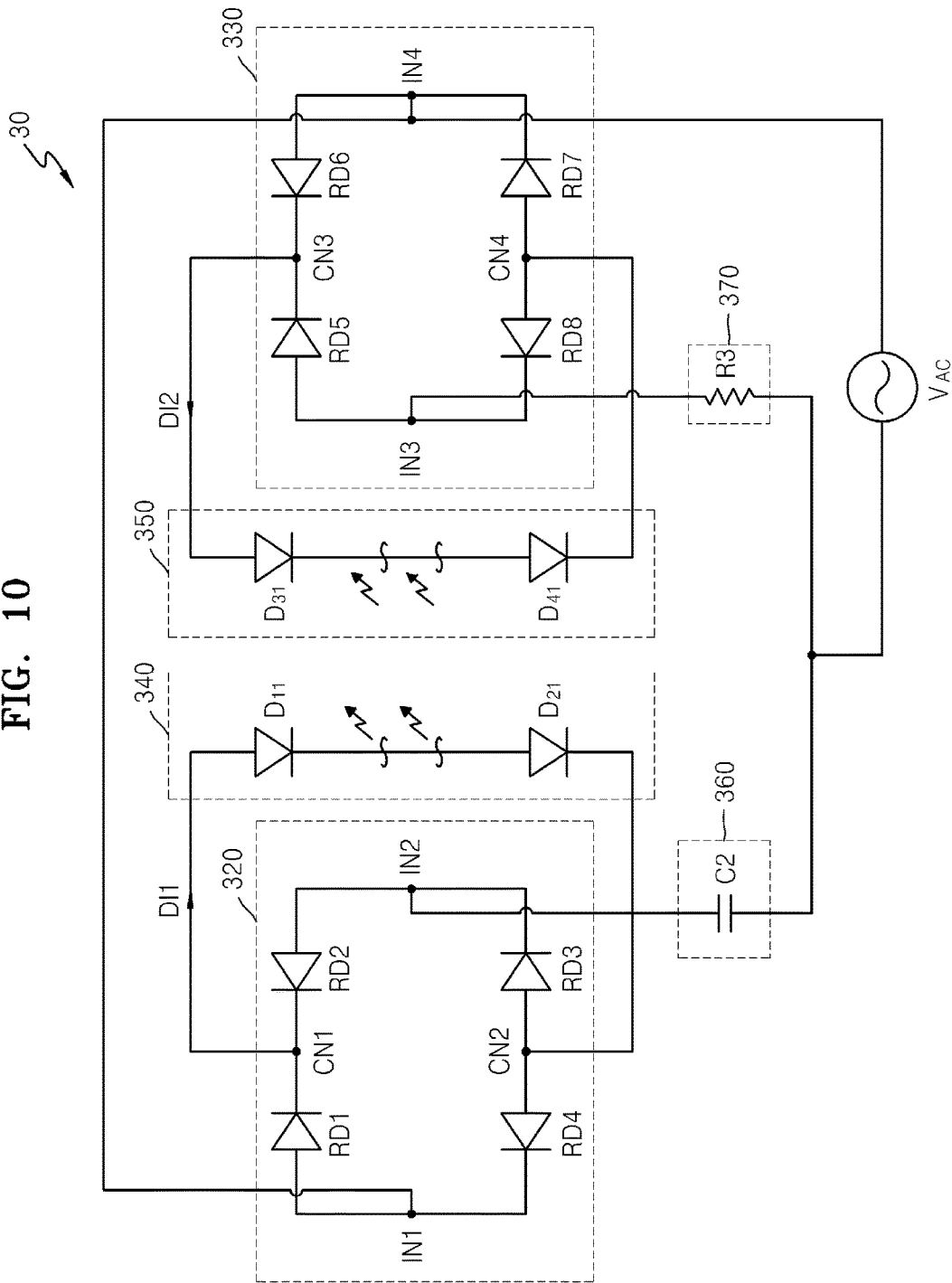
FIG. 10 is a circuit diagram schematically illustrating an electrical connection state between major structures of light-emitting apparatuses according to some exemplary embodiments of the present disclosure.
Figure 11:
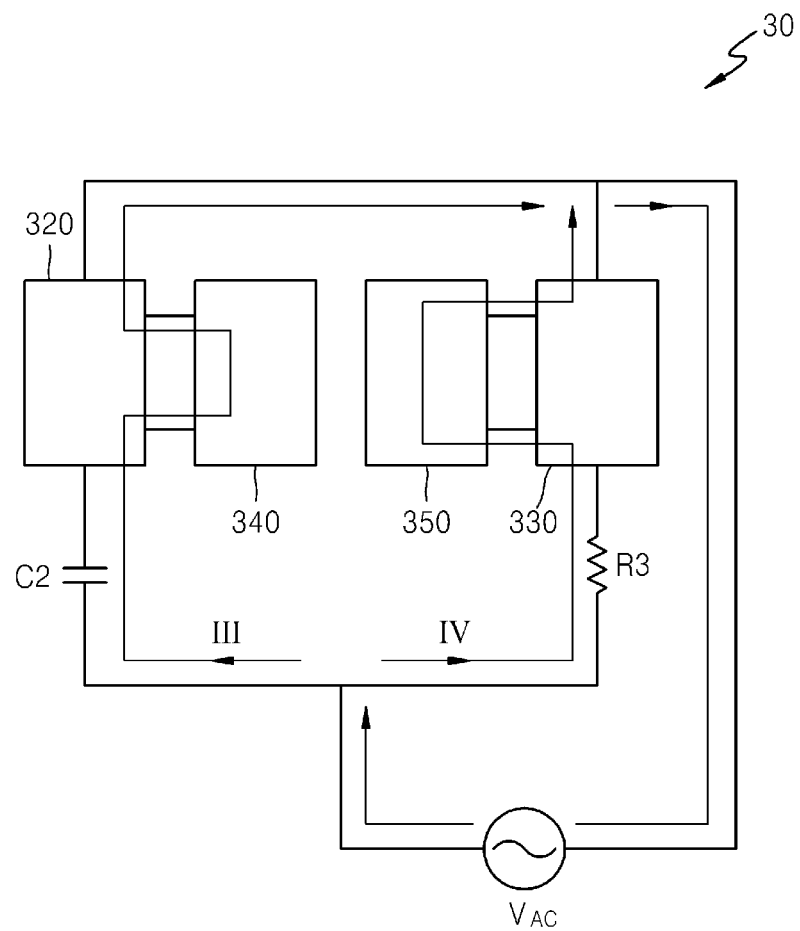
FIG. 11 is a view explaining an example of a current loop that is formed when a light-emitting apparatus of FIG. 10 is driven.

FIG. 10 is a circuit diagram schematically illustrating an electrical connection state between major structures of a light-emitting apparatus 30 according to some exemplary embodiments of the present disclosure. FIG. 11 is a view explaining an example of a current loop that is formed when the light-emitting apparatus 30 of FIG. 10 is driven. In FIGS. 10 and 11 and FIGS. 7 through 9, identical or corresponding reference numerals indicate identical or corresponding members, and a redundant explanation thereof will be omitted herein for purposes of brevity. Hereinafter, an explanation will be made of differences therebetween.

The light-emitting apparatus 30 may include a first rectifying circuit 320, a second rectifying circuit 330, a first light-emitting device 340, a second light-emitting device 350, a phase controller 360, and a third level controller 370. The light-emitting apparatus 30 may be driven by, for example, a power source which provides 100 V to 120 V of power $V_{AC}$.

The phase controller 360 may be serially connected to the first rectifying circuit 320. In detail, the phase controller 360 may be connected in series between the power source and a second input node IN2 of the first rectifying circuit 320. In some embodiments, the phase controller 360 may include a capacitor C2. However, the present disclosure is not limited thereto, and according to an impedance level, the phase controller 360 may further include a passive device, for example, a resistor or a capacitor.

The third level controller 370 may be serially connected to the second rectifying circuit 330. In detail, the third level controller 370 may be connected in series between the power source and a third input node IN3 of the second rectifying circuit 330. In some embodiments, the third level controller 370 may include a resistor R3, but it is not limited thereto.

The first rectifying circuit 320 and the phase controller 360, which are serially connected to each other, may collectively be connected in parallel to the third level controller 370 and the second rectifying circuit 330, which are serially connected to each other. In detail, a first input node IN1 of the first rectifying circuit 320 and a fourth input node IN4 of the second rectifying circuit 330 may be electrically connected to a terminal of the power source, and the phase controller 360 and the third level controller 370 may be electrically connected to another terminal of the power source.

As illustrated in FIG. 11, the power source provides the power $V_{AC}$, and a current loop III controlled by the first rectifying circuit 320 and a current loop IV controlled by the second rectifying circuit 330 may be formed. In this regard, due to the phase controller 360, a phase of the first driving current DI1 provided to the first light-emitting device 340 in the current loop III controlled by the first rectifying circuit 320 may be different from a phase of the second driving current DI2 provided to the second light-emitting device 350 in the current loop IV controlled by the second rectifying circuit 330.

Accordingly, in the light-emitting apparatus 30, the level and phase of a total output current $I_{OT}$ of light-emitting devices may be controllable, as described below in connection with FIG. 12.

Figure 12:
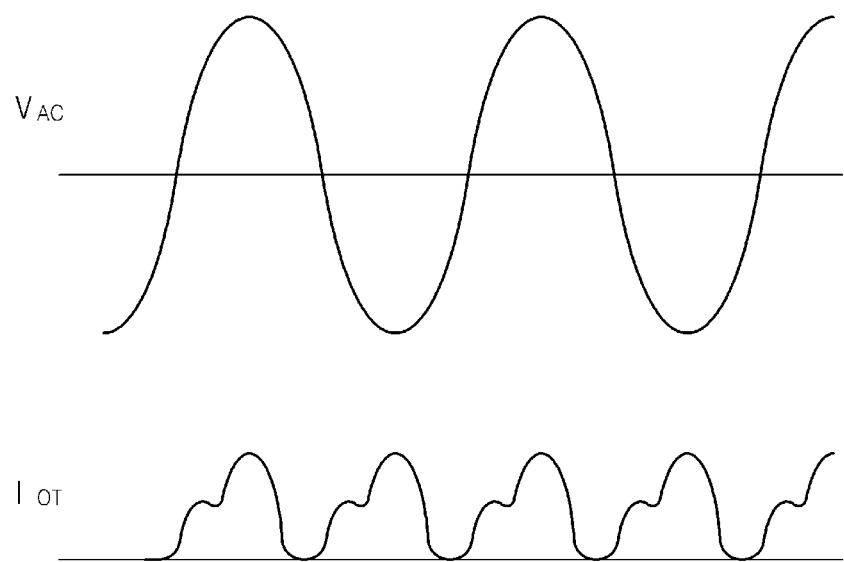
FIG. 12 is a view explaining a waveform of an output current in light-emitting apparatuses of FIGS. 8 and 10.

FIG. 12 is a view explaining a waveform of a total output current $I_{OT}$ of light-emitting devices of the light-emitting apparatuses 20 and 30 of FIGS. 8 and 10.

Referring to FIGS. 8, 9, and 12, in the light-emitting apparatus 20, due to the additional current loop I controlled by the path controller 260, an output current slowly increases in response to the power $V_{AC}$ in the current loop I. Accordingly, the light-emitting apparatus 20 may embody a waveform of the total output current $I_{OT}$ illustrated in FIG. 12.

Referring to FIGS. 10 to 12, even in the light-emitting apparatus 30, the phase controller 360 may control a phase of the output current in the current loop III controlled by the first rectifying circuit 320, and thus, the output current may slowly increase in response to the power $V_{AC}$. Accordingly, the light-emitting apparatus 30 may embody a waveform of the total output current $I_{OT}$ illustrated in FIG. 12.

As described above, in the light-emitting apparatuses 20 and 30, a resistor and a capacitor, which are passive devices, are appropriately connected to two independent rectifying circuits, so that at different levels of alternating current power, light emitting devices of the light-emitting apparatuses 20 and 30 may be independently driven, a harmonic distortion rate may be decreased, and a power factor may be improved.

While the present disclosure has been particularly shown and described with reference to exemplary embodiments thereof, it will be understood that various changes in form and details may be made therein without departing from the spirit and scope of the following claims.

What is claimed is:

1. A light-emitting device package comprising:
   a package substrate;
   first to fifth conductive patterns disposed on a top surface of the package substrate;
   a first rectifying circuit disposed on the first and second conductive patterns;
   a first light-emitting device disposed on the fifth conductive pattern and electrically connected to the first rectifying circuit;
   a second rectifying circuit disposed on the third and fourth conductive patterns; and
   a second light-emitting device disposed on the fifth conductive pattern and electrically connected to the second rectifying circuit.

2. The light-emitting device package of claim 1, wherein the first rectifying circuit comprises:
   a first diode including first and second diode elements disposed in a first substrate, the first and second diode elements sharing an electrode; and
   a second diode including third and fourth diode elements disposed in a second substrate, the third and fourth diode elements sharing an electrode.

3. The light-emitting device package of claim 2, wherein the first diode comprises:
   the first substrate;
   a first common electrode disposed on a bottom surface of the first substrate and electrically connected to the first light-emitting device;
   first and second impurity regions that are separated from each other in a top surface of the first substrate and are each doped with a second conductive impurity; and
   a first electrode disposed on each of the first and second impurity regions,
   wherein the first diode is defined by a junction of the first impurity region and the first substrate, and the second diode is defined by a junction of the second impurity region and the first substrate.

4. The light-emitting device package of claim 2, wherein the second diode comprises:
   the second substrate;
   a second common electrode disposed on a bottom surface of the second substrate and electrically connected to the first light-emitting device;
   third and fourth impurity regions that are separated from each other in a top surface of the second substrate and are each doped with a first conductive impurity; and
   a second electrode disposed on each of the third and fourth impurity regions,
   wherein a third diode is defined by a junction of the third impurity region and the second substrate, and a fourth diode is defined by a junction of the fourth impurity region and the second substrate.

5. The light-emitting device package of claim 2, wherein the first diode is mounted in a flip-chip form on the package substrate such that the first diode element is connected to the second conductive pattern and the second diode element is connected to the first conductive pattern, and
   the second diode is mounted in a flip-chip form on the package substrate such that the third diode element is connected to the first conductive pattern and the fourth diode element is connected to the second conductive pattern.

6. The light-emitting device package of claim 2, wherein the first and second substrates are conductive substrates.

7. The light-emitting device package of claim 2, wherein the first and second substrates are insulating substrates.

8. The light-emitting device package of claim 1, wherein the first and second light-emitting devices each include: at least one light-emitting device.

* * * * *